United States Patent
Yu et al.

(10) Patent No.: US 9,531,325 B2
(45) Date of Patent: Dec. 27, 2016

(54) DOHERTY POWER AMPLIFIER CIRCUIT

(71) Applicant: ZTE Corporation, Shenzhen, Guangdong (CN)

(72) Inventors: Minde Yu, Shenzhen (CN); Li Dai, Shenzhen (CN); Tianyin Qin, Shenzhen (CN); Wenyu Zhai, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 0 days.

(21) Appl. No.: 14/427,966

(22) PCT Filed: Sep. 18, 2013

(86) PCT No.: PCT/CN2013/083765
§ 371 (c)(1),
(2) Date: Mar. 12, 2015

(87) PCT Pub. No.: WO2014/044189
PCT Pub. Date: Mar. 27, 2014

(65) Prior Publication Data
US 2015/0295537 A1    Oct. 15, 2015

(30) Foreign Application Priority Data
Sep. 18, 2012  (CN) .................... 2012 2 0476291 U

(51) Int. Cl.
*H03F 3/68* (2006.01)
*H03F 1/02* (2006.01)
(Continued)

(52) U.S. Cl.
CPC .............. *H03F 1/02* (2013.01); *H03F 1/0288* (2013.01); *H03F 3/20* (2013.01); *H03F 3/245* (2013.01);
(Continued)

(58) Field of Classification Search
CPC ............ H03F 1/07; H03F 1/0288; H03F 3/68; H03F 1/3252; H03F 1/06; H03F 3/24; H03F 3/60
(Continued)

(56) References Cited

U.S. PATENT DOCUMENTS 3,662,294 A   5/1972  Jacobs
6,150,898 A   11/2000 Kushitani
(Continued)

FOREIGN PATENT DOCUMENTS

CN     1022963 C       12/1993
CN     101834332 A  *  9/2010  .............. H01P 5/185
(Continued)

OTHER PUBLICATIONS

Partial Supplementary European Search Report in European application No. 13838990.3, mailed on Sep. 24, 2015.
(Continued)

*Primary Examiner* — Steven J Mottola
*Assistant Examiner* — Hafizur Rahman
(74) *Attorney, Agent, or Firm* — Oppedahl Patent Law Firm LLC

(57) ABSTRACT

A Doherty power amplifier circuit is provided, which includes a power divider circuit, and a power amplifier circuit connected with the power divider circuit; this Doherty power amplifier circuit further includes a combination output circuit connected with the power amplifier circuit, wherein the combination output circuit is a rheostat filter coupler, or a rheostat filter, or a rheostat coupler. By adopting the circuit, the size of a power amplifier circuit can be reduced, the cost of the power amplifier circuit can be lowered, and the efficiency of a power amplifier can be improved.

2 Claims, 2 Drawing Sheets

(51) Int. Cl.
  *H03F 3/24* (2006.01)
  *H03F 3/60* (2006.01)
  *H03F 3/20* (2006.01)
(52) U.S. Cl.
  CPC ......... *H03F 3/602* (2013.01); *H03F 2200/171* (2013.01); *H03F 2200/204* (2013.01); *H03F 2200/207* (2013.01)
(58) Field of Classification Search
  USPC   330/84, 86, 124 R, 126, 130, 295; 333/117, 122, 124, 204, 205, 219, 248; 379/338, 443; 455/127.1, 143
  See application file for complete search history.

(56) References Cited

U.S. PATENT DOCUMENTS

| | | |
|---|---|---|
| 2004/0189380 A1 | 9/2004 | Myer |
| 2004/0189381 A1 | 9/2004 | Louis |
| 2006/0214732 A1 | 9/2006 | Pengelly |
| 2008/0007331 A1 | 1/2008 | Suzuki |
| 2010/0033243 A1 | 2/2010 | Okazaki |
| 2012/0105170 A1 | 5/2012 | Noori |
| 2012/0176194 A1 | 7/2012 | Kim |
| 2013/0063208 A1* | 3/2013 | Acimovic ............... H03F 3/602 330/84 |

FOREIGN PATENT DOCUMENTS

| | | | |
|---|---|---|---|
| CN | 102594266 A | 7/2012 | |
| CN | 202818232 U | 3/2013 | |
| EP | 1871004 A1 | 12/2007 | |
| EP | 2141798 A1 | 1/2010 | |
| EP | 2403135 A1 | 1/2012 | |
| EP | 2442444 A1 | 4/2012 | |
| JP | EP 1871004 A1 * | 12/2007 | ........... H03F 1/0288 |
| JP | 2010193153 A | 9/2010 | |
| JP | 2010206351 A | 9/2010 | |
| WO | 2010102531 A1 | 9/2010 | |

OTHER PUBLICATIONS

International Search Report in international application No. PCT/CN2013/083765, mailed on Dec. 26, 2013.

English Translation of the Written Opinion of the International Search Authority in international application No. PCT/CN2013/083765, mailed on Dec. 26, 2013.

Supplementary European Search Report in European application No. 13838990.3, mailed on Feb. 9, 2016.

* cited by examiner

DOHERTY POWER AMPLIFIER CIRCUIT

TECHNICAL FIELD

The disclosure relates to an electronic circuit field, and particularly relates to a Doherty power amplifier circuit.

BACKGROUND

As market competition becomes increasingly fierce, a performance level of a base station product is a main focus of intertype competition. A power amplifier unit as an important part of a base station, is directly associated with the quality and communication effect of transmitted signals. Currently, a most widely applied mature technique is a Doherty power amplifier technique, and most power amplifier manufacturers have begun to mass-produce and apply Doherty power amplifiers. In the recent years, this technique still occupies a dominant position in terms of cost and mass-production ability. Therefore, how to further reduce the size of the power amplifier based on this power amplifier technique and improve a linear property and efficiency of the power amplifier becomes even more important.

A structure of a traditional Doherty power amplifier is shown by a reference number 102 in FIG. 1, which is composed of more than two power amplifier tubes, and is divided into a main power amplifier tube and an auxiliary power amplifier tube, wherein the main power amplifier tube and the auxiliary power amplifier tube separately work in different working conditions, and improvement of efficiency is achieved through an impedance modulation technique. At a combination output end of a power amplifier circuit, modulation and matching of impedance is generally implemented through an impedance conversion line 103. For example, for a typical Doherty power amplifier circuit, the modulation and matching of the impedance are implemented by the impedance conversion line 103 which is 35 Ohms at a combination output at which two power amplifier tube perform output.

Since a small signal transmitted by a transceiver usually incidentally generates some harmonic signals after amplified by a power amplifier and these harmonic signals may interfere other components, therefore the power amplifier always has a certain requirement on the size of an output harmonic. A general method of reducing the output of harmonic signals is to add a filter at an output end; as shown in FIG. 1, a filter 105 is provided at the combination output end of the Doherty power amplifier circuit.

Additionally, the linear property is usually improved through a Digital Pre-Distortion (DPD) by the Doherty power amplifier circuit, therefore, it needs to sample a power amplifier output signal to perform DPD training, based on which a coupler may be added to the combination output end of the Doherty power amplifier circuit to implement a signal sampling function. As shown in FIG. 1 a coupler 104 is provided in the Doherty power amplifier circuit.

It can be seen from the Doherty power amplifier circuit shown in FIG. 1 that in design of the Doherty power amplifier circuit, a coupler is needed to be provided on a microstrip line of which an output is 50 Ohms to implement a DPD training function or a power control function, and the filter is provided to restrain a harmonic; and these components may occupy a certain space on a Printed Circuit Board (PCB), thus inevitably leading to increase of the size of the microstrip line at a power amplifier output end and increase of a differential loss, and further resulting in decrease of efficiency of the entire power amplifier, increase of a PCB size of the power amplifier circuit, and cost increase of the power amplifier circuit.

SUMMARY

In view of this, the embodiments of the disclosure are to provide Doherty power amplifier circuits, which can reduce the size of a power amplifier circuit, lower the cost of the power amplifier circuit, and improve efficiency of the power amplifier.

Accordingly, a technical scheme of an embodiment of the disclosure is implemented as follows.

A Doherty power amplifier circuit includes a power divider circuit, and a power amplifier circuit connected with the power divider circuit; and the Doherty power amplifier circuit further includes a combination output circuit connected with the power amplifier circuit, wherein the combination output circuit is a rheostat filter.

The rheostat filter may be formed by n pieces of microstrip lines having different sizes, which are connected in series, wherein n is an integer which is greater than 1.

A Doherty power amplifier circuit includes a power divider circuit, and a power amplifier circuit connected with the power divider circuit. The Doherty power amplifier circuit further includes a combination output circuit connected with the power amplifier circuit, wherein the combination output circuit is a rheostat coupler.

The rheostat coupler may include a primary line and a secondary line; and both the primary line and the secondary line may be microstrip lines, and the primary line and the second line may be coupled through a parallel line, or through a parallel line with a dentate structure.

The primary line may be an impedance conversion line.

A Doherty power amplifier circuit includes a power divider circuit, and a power amplifier circuit connected with the power divider circuit; and the Doherty power amplifier circuit further includes a combination output circuit connected with the power amplifier circuit, wherein the combination output circuit is a rheostat filter coupler.

The rheostat filter coupler may include a primary line and a secondary line; both the primary line and the secondary line may be microstrip lines, and the primary line and the secondary line may be coupled through a parallel line, or through a parallel line with a dentate structure; and the primary line may be formed by microstrip lines having different sizes, which are connected in series.

The Doherty power amplifier circuits provided by the embodiments of the disclosure adopt a rheostat filter coupler instead of three components at a combination output part in a traditional power amplifier circuit, namely an impedance conversion line, a coupler, and a filter, and implement an impedance conversion function, a harmonic restraint function and a power sampling function, thereby reducing the size of the power amplifier circuit, improving a power amplifier index, and lowering the cost of the power amplifier circuit.

The embodiments of the disclosure may also adopt a rheostat filter to implement a combination output circuit according to the requirement of an actual application to complete an impedance conversion function and a harmonic restraint function, or adopt a rheostat coupler to implement the combination output circuit to complete a impedance conversion function and a power sampling function.

When the combination output circuit adopts a rheostat filter, interference from an out-off-band harmonic can be effectively restrained while an impedance matching standard is reached; this implementation scheme has advantages of small area and low differential loss; the rheostat filter is implemented by a pure microstrip, which has the advantages of high reliability, low cost, and easy implementation, and small size, thus PCB layout space can be utilized effectively, and a harmonic wave index of the Doherty power amplifier circuit may be significantly improved. It is indicated according to a harmonic wave test result that the harmonic at each time is reduced, and the harmonic can be restrained effectively.

When the combination output circuit adopts a rheostat coupler, an output differential loss is reduced, the efficiency of the power amplifier between 0.015 db and 0.03 db is improved, and the size of the power amplifier circuit is significantly reduced, the entire cost of the power amplifier circuit is greatly reduced.

DETAILED DESCRIPTION

Figure 1:
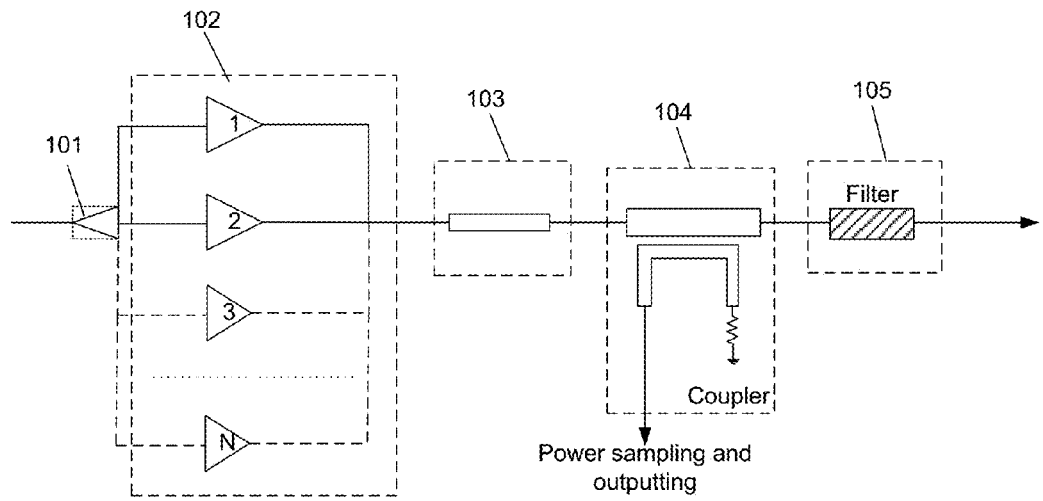
FIG. 1 is a structure view of a traditional Doherty power amplifier circuit.
Figure 2:
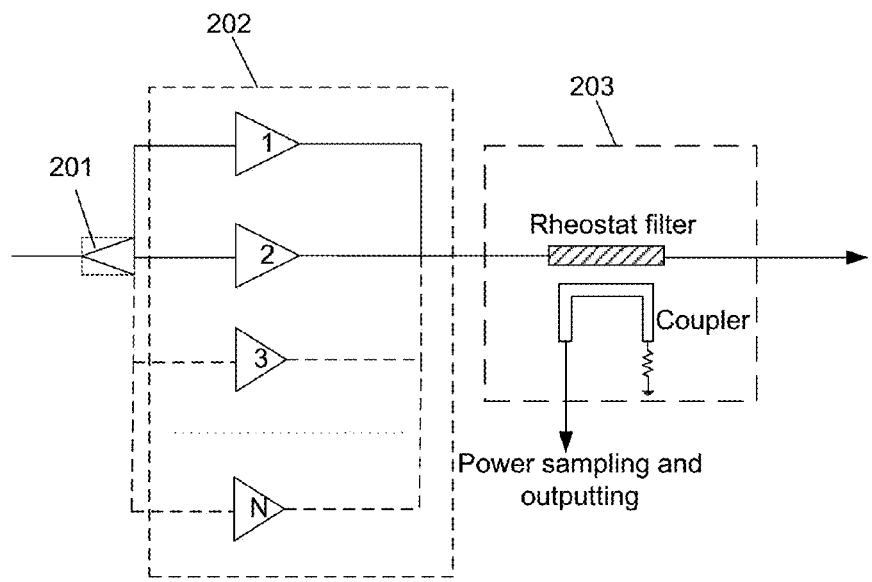
FIG. 2 is a structure view of a Doherty power amplifier circuit of the disclosure.

A structure of a Doherty power amplifier circuit of an embodiment of the disclosure is shown in FIG. 2, and this Doherty power amplifier circuit includes a power divider circuit 201, a power amplifier circuit 202, and a combination output circuit 203;

specifically, the power divider circuit 201 is configured to separate an input signal into N (1, 2, 3, . . . N) branches of signals, which are separately transmitted to the power amplifier circuit 202 composed of a master amplifier and a slave amplifier, wherein N is a natural number which is greater than or equal to 2, and is the sum of the number of the master amplifiers and the number of the slave amplifiers.

The power amplifier circuit 202 is connected with the power divider circuit and includes one master amplifier, more than one slave amplifiers, and an input/output matching circuit corresponding to each amplifier; signals input into the master amplifier and the slave amplifier are separately amplified by the master amplifier and the slave amplifier and are output to the combination output circuit 203; usually, the master amplifier and the slave amplifier are separately in different working states, for example, the master amplifier may work in an AB-type state and an auxiliary amplifier may work in a C-type state, wherein a conduction angle of an AB-type amplifier is slightly greater than 90 degrees, which can reduce crossover distortion appearing when reaching a cut-off; the conduction angle of a C-type amplifier is smaller than 90 degrees, which has a nonlinear and high efficiency property.

The above power divider circuit 201 and power amplifier circuit 202 have the same structure and function as the traditional Doherty power amplifier circuit, which will be not repeated here.

The combination output circuit 203 is configured to combine the amplified N branches of signals into one branch of signal for output, and complete impedance conversion at an output end.

Here, since different Doherty power amplifier circuits have different impedance properties at a combination end point, and a final output end of the Doherty power amplifier circuit is needed to be matched with 50 Ohms, therefore the combination output circuit 203 has an impedance conversion function.

Further, the combination output circuit 203 is also configured to implement a harmonic restraint function and/or a signal sampling function. Therefore, the combination output circuit 203 may be a rheostat filter coupler, or may be a rheostat filter, or may be a rheostat coupler; the combination output circuit 203 shown in FIG. 2 is a rheostat filter coupler.

Specifically, when the combination output circuit 203 is a rheostat filter coupler, the rheostat filter and the rheostat coupler are integrated into one circuit, primary line impedance conversion of the filter coupler is implemented using a rheostat filter. This combination output circuit 203 simultaneously has an impedance conversion function, a harmonic restraint function and a signal sampling function. When the combination output circuit 203 is a rheostat filter, the combination output circuit 203 has the impedance conversion function and the harmonic restraint function. When the combination output circuit 203 is a rheostat coupler, the combination output circuit 203 has the impedance conversion function and the signal sampling function.

The Doherty power amplifier circuit of an embodiment of the disclosure implements changes in the working states through impedance modulation in different signal states, to improve efficiency of a power amplifier for a small signal and guarantee the linear property for a big signal. In addition, the Doherty power amplifier circuit of the embodiment of the disclosure integrates functions of the impedance conversion line, the coupler, and the filter, and makes the combination output circuit have the harmonic restraint function and/or the signal sampling function while achieving the impedance conversion, according to a requirement of an actual application.

The disclosure is further explained in combination with an appended drawing and a specific embodiment below.

Figure 3:
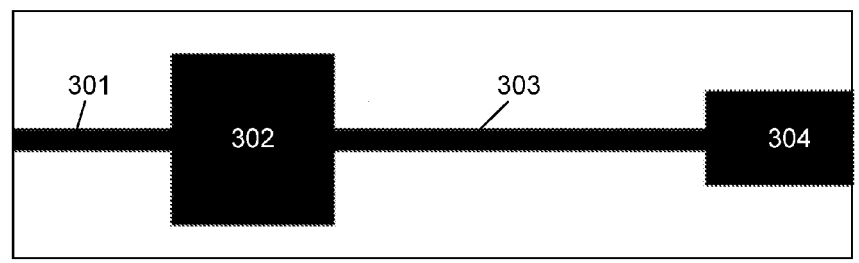
FIG. 3 is a structure view of an instance of the disclosure in which a combination output circuit is a rheostat filter.

When the combination output circuit 203 is a rheostat filter, the structure of the rheostat filter is shown in FIG. 3, and this rheostat filter is formed by microstrip lines 301, 302, 303, and 304 having different sizes, which are connected in series. The length of the four microstrip lines here is ⅟₁₆ wave length, and characteristic impedances are separately 53 Ohms, 12 Ohms, 96 Ohms and 23 Ohms; a specific length and width of each microstrip line can be obtained through conversion according to an electrical length and an impedance parameter, and the entire microstrip lines can implement the impedance conversion function and harmonic restraint function. Of course, in the actual application, the size may be slightly changed, and implementation of the functions may not be influenced.

In the actual application, the number of microstrip lines which form the rheostat filter may be not four, but may be n which is as long as an integer greater than 1; how many microstrip lines will be used depends on different index requirements in the actual application such as a bandwidth, a standing-wave ratio, and etc.

Here, the microstrip line is a microwave line, the microstrip lines having different sizes and forms may be equivalent to corresponding inductance capacitances, therefore the microwave elements in various usages may be constructed by the microstrip lines. In an embodiment of the disclosure, the rheostat filter coupler, the rheostat filter, and the rheostat coupler which are taken as the combination output circuit are all implemented by the microstrip lines.

In an embodiment, the number of the microstrip lines and the size of each microstrip line are mainly determined by various condition parameter variables, such a filter type, a working frequency, a panel parameter, a matching impedance, a bandwidth, a restrain amount, a ripple, a transmission power, and etc. The rheostat filter in the embodiment of the disclosure is mainly for restraining a 3rd harmonic in the Doherty power amplifier; a working frequency band of the Doherty power amplifier is 920 MHz~960 MHz, and the working frequency band of the 3rd harmonic is 2760 MHz~2880 MHz, therefore interference generated by the 3rd harmonic and influence to a waveform of the Doherty power amplifier are serious. Generally, a low-pass filter may be adopted as a prototype, and then transformed into a microstrip line after being computed by software, in this way, the attenuation in the frequency band of the 3rd harmonic will be more than 10 dB, the attenuation within the working frequency band of the Doherty power amplifier will be smaller than 0.06 dB, and simultaneously the impedance at an output end will be changed from 25 Ohms to 50 Ohms, thereby achieving a function of restraining 3rd harmonic in the Doherty power amplifier. Here, the specific inner design of the rheostat filter can be found in the related art, and will not be repeated here.

Figure 4:
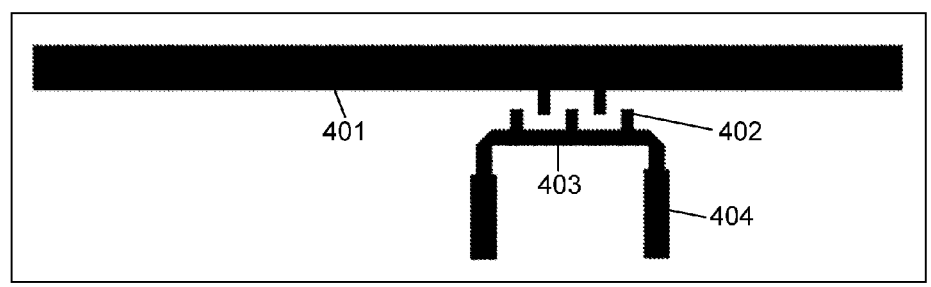
FIG. 4 is a structure view of an instance of the disclosure in which a combination output circuit is a rheostat coupler.

When the combination output circuit 203 is a rheostat coupler, the rheostat coupler may also adopt the microstrip line to implement the impedance conversion and power sampling. The structure of the rheostat coupler is shown in FIG. 4, and the rheostat coupler includes a primary line 401 and a secondary line 403, both the primary line 401 and the secondary line 403 are microstrip lines, and the primary line 401 and the secondary line 403 are coupled through a parallel line with a dentate structure 402; the primary line 401 is an impedance conversion line, and may transmit power, implement the impedance conversion, and change an impedance from non-50 Ohms to 50 Ohms.

In the actual application, the primary line 401 may be coupled with the secondary line 403 to transfer a part of its power to the secondary line 403 by many ways, which intervene with each other. The coupling ways may be a parallel line, or may be a parallel line with a dentate structure, for example, a parallel line with a rectangle, a parallel line with a triangle, and etc. The parallel line coupling is generally adopted; the dentate structure may be added to the parallel line coupling to further improve performance of the coupler. Power is only transmitted along one direction in the secondary line 403 to implement power sampling and is finally output by a line 404 which is 50 Ohms.

Figure 5:
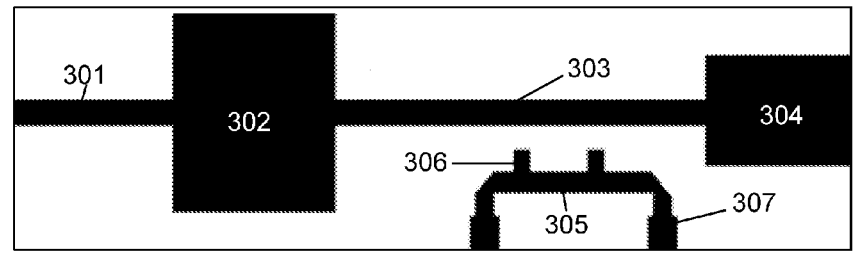
FIG. 5 is a structure view of an instance of the disclosure in which a combination output circuit is a rheostat filter coupler.

When the combination output circuit 203 is a rheostat filter coupler, the rheostat filter and the rheostat coupler are integrated into one circuit, and primary line impedance conversion of the rheostat coupler is implemented by the rheostat filter. The structure of the rheostat filter coupler is shown in FIG. 5, and is composed of multiple microstrip lines having different sizes in length and width.

Specifically, the rheostat filter coupler includes a primary line and a second line 305, both the primary line and the second line 305 are microstrip lines, the primary line and the second line 305 are coupled through a parallel line with a dentate structure 306;

wherein the primary line is formed by microstrip lines 301, 302, 303, and 304 having different sizes which are connected in series, to implement the impedance conversion and the harmonic restraint, namely a rheostat filter microstrip line is employed as the primary line; the secondary line 305 is for power sampling, and the power is finally output by a line 307 which is 50 Ohms, namely the secondary line adopting the rheostat coupler microstrip line is taken as the secondary line 305 of the rheostat filter coupler.

All those described above are only embodiments of the disclosure, and are not used to limit the protection scope of the disclosure.

INDUSTRIAL APPLICABILITY

The Doherty power amplifier circuits provided by the embodiments of the disclosure adopt a rheostat filter coupler to implement three components of a combination output part in the traditional power amplifier circuit, namely the impedance conversion line, the coupler, and the filter, and simultaneously implements the impedance conversion function, the harmonic restraint function and the power sampling function, thereby being capable of reducing the size of the power amplifier circuit, improving a power amplifier index, and lowering the cost of the power amplifier circuit.

What is claimed is:

1. A Doherty power amplifier circuit, comprising a power divider circuit, and a power amplifier circuit connected with the power divider circuit; and the Doherty power amplifier circuit further comprising a combination output circuit connected with the power amplifier circuit, wherein the combination output circuit is a rheostat filter, wherein the rheostat filter is formed by microstrip lines having different sizes, which are connected in series, and the length of the four microstrip lines is $\frac{1}{16}$ wave length, and characteristic impedances are separately 53 Ohms, 12 Ohms, 96 Ohms and 23 Ohms.

2. A Doherty power amplifier circuit, comprising a power divider circuit, and a power amplifier circuit connected with the power divider circuit; and the Doherty power amplifier circuit further comprising a combination output circuit connected with the power amplifier circuit, wherein the combination output circuit is a rheostat filter coupler, wherein the rheostat filter coupler comprises a primary line and a secondary line; both the primary line and the secondary line are microstrip lines, and the primary line and the secondary line are coupled through a parallel line, or through a parallel line with a dentate structure; and the primary line is formed by microstrip lines having different sizes, which are connected in series, to implement impedance conversion and harmonic restraint.

* * * * *